United States Patent
Madan et al.

(10) Patent No.: US 9,806,734 B1
(45) Date of Patent: Oct. 31, 2017

(54) SAR ANALOG-TO-DIGITAL CONVERTER SELECTIVE SYNCHRONIZATION

(71) Applicant: Analog Devices Global, Hamilton (BM)

(72) Inventors: Arvind Madan, Bangalore (IN); Sandeep Monangi, Srikakulam (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/343,361

(22) Filed: Nov. 4, 2016

(51) Int. Cl.
*H03M 1/34* (2006.01)
*H03M 1/12* (2006.01)
*H03M 1/46* (2006.01)

(52) U.S. Cl.
CPC ........... *H03M 1/1245* (2013.01); *H03M 1/46* (2013.01)

(58) Field of Classification Search
CPC .............................. H03M 1/1245; H03M 1/46
USPC ................... 341/163, 155, 144, 156
See application file for complete search history.

(56) References Cited

U.S. PATENT DOCUMENTS

| | | | | |
|---|---|---|---|---|
| 7,023,373 B2* | 4/2006 | da Fonte Dias | .... | H03M 1/1225 341/161 |
| 7,053,810 B2* | 5/2006 | Harada | ............... | H03M 1/1225 341/163 |
| 8,513,989 B1* | 8/2013 | Martin | ...................... | H03L 7/00 327/146 |
| 2006/0290556 A1* | 12/2006 | Sherry | ................ | H03M 1/0624 341/156 |

* cited by examiner

*Primary Examiner* — Peguy Jean Pierre
(74) *Attorney, Agent, or Firm* — Schwegman Lundberg & Woessner, P.A.

(57) ABSTRACT

A successive approximation routine (SAR) analog-to-digital converter integrated circuit can include multiple analog-to-digital converters (ADCs) sharing a reference voltage that can be perturbed by a capacitor array of a digital-to-analog converter (DAC) sampling the reference voltage, which can limit conversion accuracy. Synchronizing every bit trial across the ADCs can improve accuracy but can slow the conversion. Synchronizing a subset of at least one, but fewer than N, bit trials across ADCs can help obtain both speed and robustness. This selected subset can include bit trials corresponding to pro-defined critical events, such as those events for which a stable reference voltage node is particularly desirable.

23 Claims, 3 Drawing Sheets

SAR ANALOG-TO-DIGITAL CONVERTER SELECTIVE SYNCHRONIZATION

TECHNICAL FIELD

This document pertains generally, but not by way of limitation, to integrated circuits, and more particularly, to Successive Approximation Routine (SAR) Analog-to-Digital Converter (ADC) circuit and its selective synchronization.

BACKGROUND

An analog-to-digital converter (ADC) circuit can be used to convert an analog signal to a digital signal, which can then be further processed or used in the digital domain. A Successive Approximation Routine (SAR) ADC circuit can carry out bit trials to compare portions of the analog signal to a reference voltage to determine the digital bit values of a digital word representing a particular sample of the analog signal. A SAR ADC can use a capacitor array of a Digital-to-Analog Converter (DAC) for carrying out the bit trials for determining the respective digital bit values of the digital word. The bit trials can involve a certain amount of time, such as can be needed for a DAC signal to settle from a transient value to a stable value, for a preamplifier to provide gain amplification of a DAC signal to a particular level, and for a latch circuit to regenerate the preamplifier output to give a bit trial result. However, high speed bit trials are desired to obtain high speed signal conversion of the ADC.

A multichannel ADC integrated circuit (IC) can include multiple channels, individual channels including separate ADCs that can share a common precision reference voltage, for performing the bit trials, such as can be provided, stabilized, and stored on a large off-chip capacitor.

SUMMARY OF THE DISCLOSURE

The present inventors have recognized, among other things that sharing a reference voltage between ADCs can create crosstalk between the ADCs, particularly when the ADCs are allowed to operate asynchronously, which can be desirable to increase, optimize, or maximize conversion speed of the individual ADCs. When selected capacitors of a DAC are switched to connect to the reference voltage node for a bit trial, charging such selected capacitor to the reference voltage will draw a current from the reference voltage node. This can perturb the reference voltage even if the reference voltage node is being actively stabilized by an amplifier and maintained on a large off-chip storage capacitor.

Although synchronizing each bit trial of the various ADCs to the corresponding bit trial of the other ADCs can provide a "quiet" time for conversion during which crosstalk can be avoided, such synchronization can slow the conversion process.

This disclosure presents another approach of addressing this issue, which can be to synchronize only a carefully selected subset of at least one, but fewer than N. of the bit trials across all (or across a selected subset of at least 2 of the ADCs on the same IC chip. This selected subset of at least one, but fewer than N, of the bit trials to be synchronized with all or a selected subset of other ADCs on the same IC can include bit trials corresponding to pre-defined critical events, such as those events for which a stable reference voltage node is particularly desirable. This can help obtain both good speed and robustness.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document describes, among other things, techniques that can be used to synchronize only a carefully selected subset of at least one, but fewer than N, of the bit trials across all (or across a selected subset of at least 2 of the ADCs on the same IC chip. This selected subset of at least one, but fewer than N, of the bit trials to be synchronized with all or a selected subset of other ADCs on the same IC can include bit trials corresponding to pre-defined critical events, such as those events for which a stable reference voltage node is particularly desirable. This can help obtain both good speed and robustness.

Figure 1:
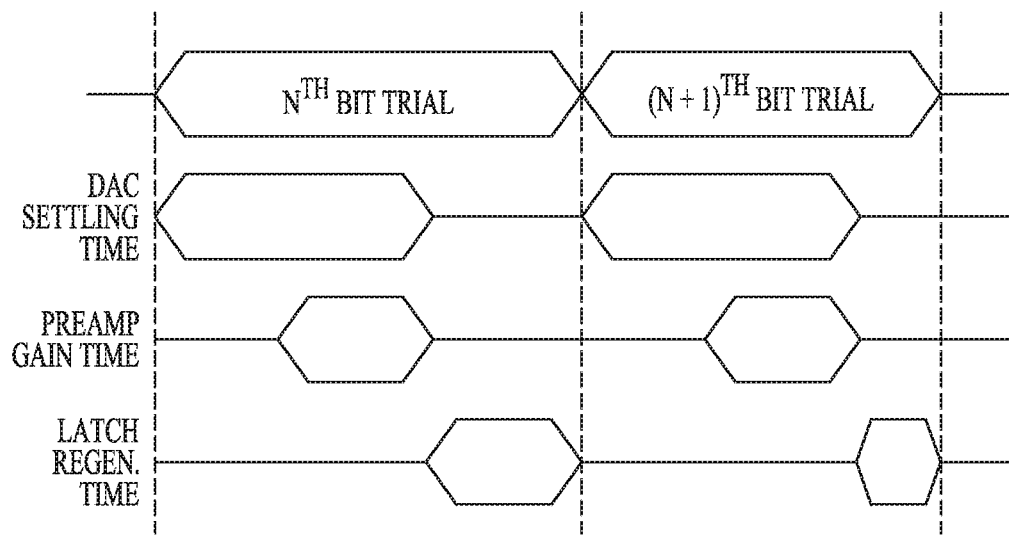
FIG. 1 is a timing diagram illustrating variability in timing between successive bit trials of an analog-to-digital conversion in a given analog-to-digital converter (ADC) circuit.

FIG. 1 is a timing diagram illustrating variability in timing between successive bit trials of an analog-to-digital conversion in a given analog-to-digital converter (ADC) circuit. FIG. 1 shows an example in which the $N^{th}$ bit trial takes longer than the $(N-1)^{th}$ bit trial even when their respective digital-to-analog (DAC) conversion times and preamplifier gain times are the same. At the end of a bit trial, the bit trial result can be latched by a regenerative latch circuit. The regeneration involved in latching the bit trial result can introduce time variability, such as can be signal-dependent and can involve a degree of metastability in the regenerative latching, such as illustrated conceptually in FIG. 1. The regenerative latch circuit can operate asynchronously, with logic at the output of the latch circuit indicating when latching is complete and, therefore, that the bit trial of that ADC circuit is complete. Regenerative latching time-variability or other time-variability during a bit trial can slow down an analog-to-digital conversion of an ADC experiencing a long bit trial. Operating ADCs of different channels asynchronously can lead to improved conversion times, but can increase susceptibility to reference voltage perturbations from other asynchronously operated ADCs, which can perturb the reference voltage during such times when a particular ADC most needs the reference voltage to be stable for sampling during its bit trial. If there are multiple ADCs operating asynchronously on different channels of a single integrated circuit die, even if each individual ADC is trimmed to a given conversion time, the overall combined conversion time of the group of all of the ADCs can vary, for example, such as because of the trimming resolution, or because of an occurrence of a metastable event in a latch circuit leading to a particularly long bit trial. There may not be any "quiet time" available during the conversion for critically sensitive sampling events. Capacitive loading on the shared voltage reference node can become much more unpredictable.

One way of addressing this issue is by completely synchronizing all ADCs on the IC completely, such that for each $i^{th}$ bit trial of the N bit trials (i=, 2, ... N) of each of the ADCs, upon completion of that particular $i^{th}$ bit trial, each and every one of the ADCs waits for the corresponding ith bit trial of all of the other ADCs on the IC to finish, before proceeding to the $(i+1)^{th}$ bit trial. A slow bit trial in one ADC (because of longer regeneration time or different DAC settling/comparator gain time) will slow down all of the other ADCs.

Another approach of addressing this issue is to synchronize only a carefully selected subset of at least one, but fewer than N, of the bit trials across all (or across a selected subset of at least 2 of the ADCs on the same IC chip. This selected subset of at least one, but fewer than N, of the bit trials to be synchronized with all or a selected subset of other ADCs on the same IC can include bit trials corresponding to pre-defined critical events, such as those events for which a stable reference voltage node is particularly desirable. Examples of such pre-defined critical events to be synchronized can include (or can be limited to): (1) sampling of a residue amplifier of a first-stage of a pipelined or other staged ADC, (2) selected one or more bit trials that draw the most current from the reference voltage node, such as the most significant bit (MSB) bit trial, which can place the largest selected capacitance value of the DAC onto the reference voltage node; or both (1) and (2).

Figure 2:
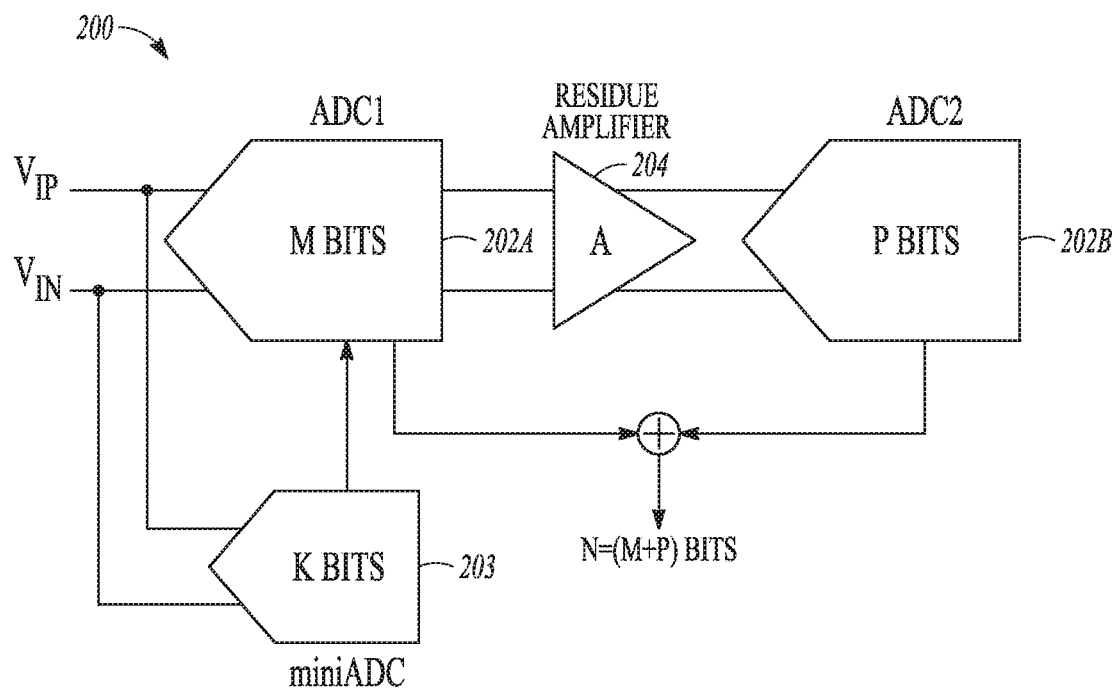
FIG. 2 shows an example of one channel of a pipelined ADC in a multi-channel analog-to-digital converter IC

FIG. 2 shows an example of one channel 200 of a pipelined multi-channel analog-to-digital converter IC. In the example of FIG. 2, the channel 200 can include an ADC 202 that can include a first stage ADC1 202A, a second stage ADC2 202B, and an auxiliary "mini ADC 203." The sampled analog input signal (to be converted into an N-bit digital word), such as the differential signal between Vip and Vin, can be provided to both the mini ADC 203 and the first stage ADC1 202A. The mini ADC 203 can be configured to more quickly (than the first stage ADC1 202A) resolve the first (e.g., most-significant) K bits of the M bits to be resolved by the first-stage ADC1 202A, where K<M. This can be accomplished using a different miniADC type (e.g., a flash ADC 203 and a SAR ADC 202A), or by using smaller capacitors in a SAR mini ADC 203, since it need not have the full resolution needed from the first stage ADC1 202A, or using another technique. The mini ADC 203 can provide the conversion result of the K bits that it converted to the first stage ADC1 202A. This can be used by the first stage ADC1 202A for converting the remaining M-K bits, such as by using SAR bit trials.

A residue amplifier (RA) 204 can receive the residue left from the conversion of the first M bits by the first stage ADC1 202A. The RA 204 can amplify the residue and output that amplified residue to inputs of the second stage ADC2 202B, for converting the residue into the remaining P=N-K bits. In an example, the sampling of the residue provided by the RA 204 to the second stage ADC2 202B, after the first M bits have been converted, and before conversion of the $(M+1)^{th}$ bit by the second ADC2 202B constitutes a pre-defined critical event to be synchronized across one or more or all other channels of ADCs on the same IC, before any one of these other ADCs performs its bit trial for conversion of its respective (M+1) bit. In an example, the other bit trials need not be synchronized across the other ADCs on the same IC. In an example, only some (those corresponding to pre-defined critical events) but not all of the other bit trials can also be synchronized across the other ADCs on the same IC.

In another example, the $i^{th}$ bit trial that places the largest DAC capacitor array capacitance value onto the reference voltage can be synchronized across the other ADCs of other channels on the same IC, since this is most likely to perturb the reference voltage and, therefore, it can be desirable to time the sampling when the reference voltage is more likely to be stable. In certain examples, the $i^{th}$ bit trial that places the largest DAC capacitor array capacitance value onto the reference voltage is the most significant bit (MSB) bit trial, such that it is the MSB bit trial that is synchronized across the ADCs on the same IC, rather than all bit trials. In other examples, such as in a pipelined SAR ADC, the largest capacitor is switched onto the reference voltage when bit trial results of a mini ADC are loaded onto a first stage ADC1. In such examples, this event can be synchronized across all ADCs on the same IC.

As explained above, synchronizing some, but not all, of the N bit trials across ADCs on different channels of the same IC can allow accurate operation using a reference voltage node shared across the different channels of the same IC, while still allowing higher speed conversion permitted by allowing the other one or more bit trials to remain unsynchronized across ADCs of different channels on the same IC.

Figure 3:
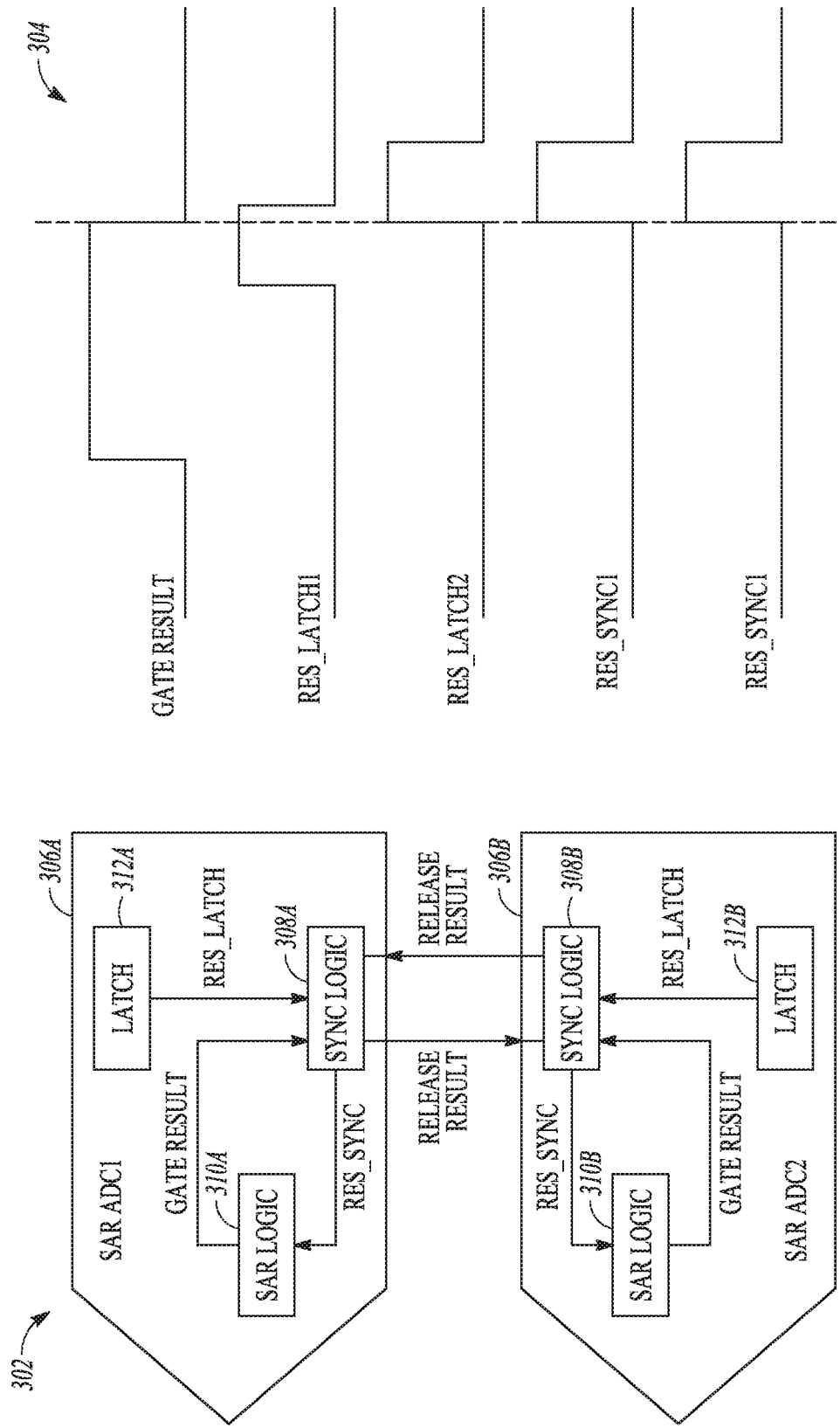
FIG. 3A shows a block diagram of portions of a multi-channel ADC.
FIG. 3B shows an accompanying timing diagram for synchronizing across ADCs of different channels on the same IC for the example of FIG. 3A.

FIG. 3A shows a block diagram of portions of a multi-channel ADC 302 and FIG. 3B shows an accompanying timing diagram 304 for synchronizing across ADCs of different channels on the same IC. Although FIG. 3A shows portions of two ADCs 306A, B, this is for ease of illustration; FIG. 3A is intended to represent any number of channels and any corresponding number of ADCs. Each ADC channel can include synchronization logic 308, successive approximation routine (SAR) logic 310, and a bit trial result latch 312. If the $i^{th}$ bit trial (of the N bit trials) is a critical event, as explained above, then it can be desired to synchronize from the beginning of this $i^{th}$ bit trial across all of the ADCs on the various channels of the same IC. First, gate the propagation of the ADC bit trial result of the $(i-1)^{th}$ bit trial to the SAR logic. Then, release the result of the $(i-1)^{th}$ bit trial to the SAR logic 310 only after the $(i-1)^{th}$ bit trial result of each and every one of the ADCs on the various channels of the same IC have become available.

The timing diagram 304 illustrates an example of this. In the timing diagram 304, the results of the $(i-1)^{th}$ bit trial become available at two different times, shown by the res_latch1 signal transitioning from low to high earlier than the res_latch2 signal transitioning from low to high. The sync logic 308 generates a gate result signal that releases the result of the $(i-1)^{th}$ bit trial to the SAR logic 310 only when both results (or all $(i-1)^{th}$ bit trial results of all ADCs in the more general case) have become available, such as indicated by the res_sync1 signal that permits the first ADC 306A to proceed with its $i^{th}$ bit trial and the synchronized res_sync2 signal that permits the second ADC 306B to proceed with its $i^{th}$ bit trial. This ensures that the start of the $i^{th}$ bit trial is synchronized across the two or more various ADCs.

Figure 4:
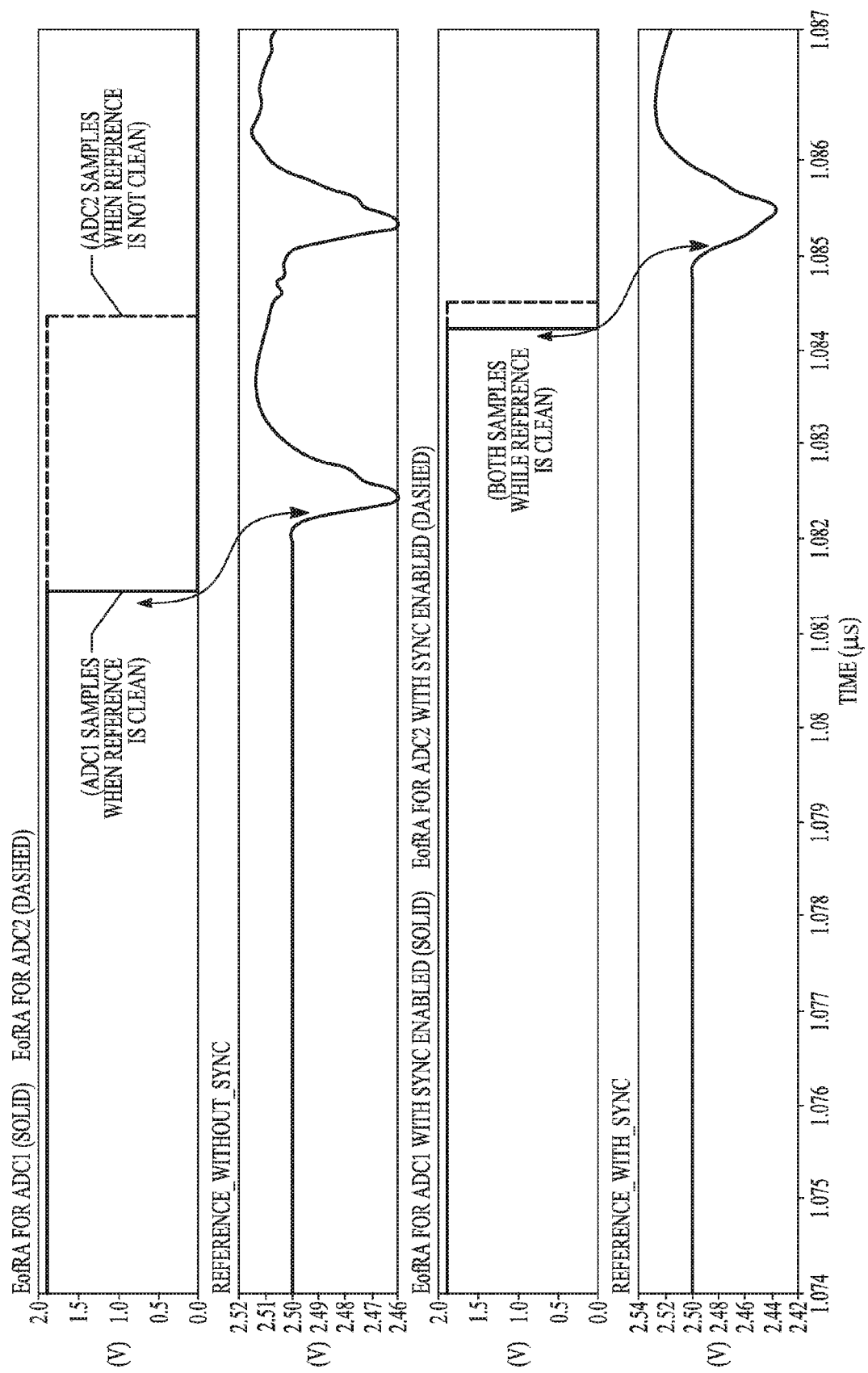
FIG. 4 is a computer simulation transient analysis result showing variations in a reference voltage shared between two different ADCs, for both synchronized and unsynchronized cases

FIG. 4 is a computer simulation transient analysis result showing variations in a reference voltage shared between two different ADCs, for both synchronized and unsynchronized cases, such as for allowing comparison therebetween. In FIG. 4, the top-most signal trace shows edge transitions indicating residue amplifier (RA) sampling events for two unsynchronized ADCs. The second-from-top signal trace shows perturbations on the reference voltage node, which occur at different times and, due to the asynchronous operation of the two ADCs, results in the second ADC sampling the reference voltage when it is still recovering from perturbation by the first ADC, which can lead to inaccuracy in the conversion of the synchronized $i^{th}$ bit trial. The third-from-top signal trace shows edge transition indicating RA sampling events for two synchronized ADCs. The bottom signal trace shows a corresponding unperturbed reference voltage during RA sampling of both of the synchronized ADCs, which will improve the accuracy of the conversion of the synchronized $i^{th}$ bit trial.

As explained herein, the present approach can involve synchronizing only a carefully selected subset of at least one, but fewer than N, of the bit trials across all (or across a selected subset of at least 2 of the ADCs on the same IC chip. This selected subset of at least one, but fewer than N, of the bit trials to be synchronized with all or a selected subset of other ADCs on the same IC can include bit trials corresponding to pre-defined critical events. such as those events for which a stable reference voltage node is particularly desirable. This can help optimize the tradeoff between speed and robustness. Examples of pre-defined critical events were explained above. One way to determine which events are to be pre-defined as critical events is to regard as critical decision points only those decision points in which the DAC comparator settling error just before SAR bit trial decision, due to lack of synchronization, is higher than an error budget such as the redundancy budget for the analog-to-digital conversion. For example, the first bit trial of ADC1 in pipelined SAR, such as shown in FIG. 2, will draw highest current from reference node compared to any other bit trials and likely to cause long settling transients on reference. If this bit trial is not synchronized, it is likely to cause errors in other ADCs larger than their available redundancy. However, this same criterion can also be applied to one or more other bit trials to determine whether they should be regarded and pre-defined as critical decision points that should be synchronized across various selected ADCs (or all ADCs) of the multiple channel ADC IC using a shared reference voltage, while leaving one or more others of the bit trials unsynchronized to improve conversion speed.

Various Notes

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third." etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A successive approximation routine (SAR) multichannel analog-to-digital converter (ADC) integrated circuit device with multiple channels respectively including corresponding individual N-bit ADCs on the same integrated circuit to concurrently perform analog-to-digital conversions in parallel to concurrently convert respective analog signal samples into respective N-bit digital words using a reference voltage circuit shared by ADCs of different channels for bit trials, comprising:
a synchronization circuit to synchronize between at least two channels a predefined subset of at least one, but fewer than N, of the bit trials across a selected subset of at least two of the ADCs in different ones of the multiple channels.

2. The device of claim 1, in which the pre-defined subset includes at least one of:
(1) a bit trial for sampling a residue amplifier of a first-stage of a pipelined or other staged ADC;
(2) a bit trial of a first-stage ADC of a pipelined or other staged ADC occurring upon loading bit trial results of an auxiliary mini ADC onto the first stage ADC;
(3) a most significant bit (MSB) bit trial of a digital-to-analog converter (DAC); or
(4) a selected bit trial of the N-bits placing a largest capacitance value onto a reference voltage node.

3. The device of claim 1, in which the pre-defined subset includes a bit trial for sampling a residue amplifier of a first-stage of a pipelined or other staged ADC.

4. The device of claim 1, in which the pre-defined subset includes a bit trial of a first-stage ADC of a pipelined or other staged ADC occurring upon loading bit trial results of an auxiliary mini ADC onto the first stage ADC.

5. The device of claim 1, in which the pre-defined subset includes a most significant bit (MSB) bit trial of a digital-to-analog converter (DAC).

6. The device of claim 1, in which the pre-defined subset includes a selected bit trial of the N-bits placing a largest capacitance value onto a reference voltage node.

7. The device of claim 1, in which the pre-defined subset is limited to one or more bit trials in which a digital-to-analog (DAC) converter error just before SAR bit trial decision exceeds an error budget for the N-bit analog-to-digital conversion.

8. The device of claim 1, in which synchronization occurs at the beginning of a synchronized bit trial in the predefined subset of bit trials to be synchronized across ADCs.

9. The device of claim 1, in which the pre-defined subset is limited to only one of:
(1) a bit trial for sampling a residue amplifier of a first-stage of a pipelined or other staged ADC;
(2) a bit trial of a first-stage ADC of a pipelined or other staged ADC occurring upon loading bit trial results of an auxiliary mini ADC onto the first stage ADC;
(3) a most significant bit (MSB) bit trial; or
(4) a selected bit trial of the N-bits placing a largest capacitance value onto a reference voltage node.

10. The device of claim 1, in which the synchronizing circuit operates to synchronize results of corresponding individual bit trials.

11. A successive approximation routine (SAR) multichannel analog-to-digital conversion (ADC) method of performing multiple N-bit ADCs of respective analog signal samples into respective N-bit digital words concurrently on the same integrated circuit using different channels including respective ADC circuits and sharing reference signal for use by the different channels during the concurrent analog-to-digital conversions, the method comprising:
performing the concurrent analog-to-digital conversions in SAR bit trials; and
synchronizing, between at least two channels, a predefined subset of at least one, but fewer than N, of the bit trials across a selected subset of at least two of the ADCs in different ones of multiple channels.

12. The method of claim 11, in which the pre-defined subset includes at least one of:
(1) a bit trial for sampling a residue amplifier of a first-stage of a pipelined or other staged ADC circuit;
(2) a bit trial of a first-stage ADC circuit of a pipelined or other staged ADC circuit occurring upon loading bit trial results of an auxiliary mini ADC circuit onto the first stage ADC circuit;
(3) a most significant bit (MSB) bit trial of a digital-to-analog converter (DAC); or
(4) a selected bit trial of the N-bits placing a largest capacitance value onto a reference voltage node.

13. The device of claim 11, in which the pre-defined subset includes a bit trial for sampling a residue amplifier of a first-stage of a pipelined or other staged ADC circuit.

14. The device of claim 11, in which the pre-defined subset includes a bit trial of a first-stage ADC circuit of a pipelined or other staged ADC circuit occurring upon loading bit trial results of an auxiliary mini ADC circuit onto the first stage ADC circuit.

15. The device of claim 11, in which the pre-defined subset includes a most significant bit (MSB) bit trial of a digital-to-analog converter (DAC).

16. The device of claim 11, in which the pre-defined subset includes a selected bit trial of the N-bits placing a largest capacitance value onto a reference voltage node.

17. The device of claim 11, in which the pre-defined subset is limited to one or more bit trials in which a digital-to-analog (DAC) converter error just before SAR bit trial decision exceeds an error budget for the N-bit analog-to-digital conversion.

18. The device of claim 11, in which synchronization occurs at the beginning of a synchronized bit trial in the predefined subset of bit trials to be synchronized across ADCs.

19. The device of claim 11, in which the pre-defined subset is limited to only one of:
(1) a bit trial for sampling a residue amplifier of a first-stage of a pipelined or other staged ADC;
(2) a bit trial of a first-stage ADC of a pipelined or other staged ADC occurring upon loading bit trial results of an auxiliary mini ADC onto the first stage ADC;
(3) a most significant bit (MSB) bit trial; or
(4) a selected bit trial of the N-bits placing a largest capacitance value onto a reference voltage node.

20. The method of claim 11, in which the synchronizing include synchronizing results of corresponding individual bit trials.

21. A successive approximation routine (SAR) multichannel analog-to-digital conversion (ADC) method of performing multiple N-bit ADCs of respective analog signal samples into respective N-bit digital words concurrently on the same integrated circuit using different channels including respective ADC circuits and sharing reference signal for use by the different channels during the concurrent analog-to-digital conversions the method comprising:

performing the concurrent analog-to-digital conversions in SAR bit trials; and synchronizing, between all channels, a predefined subset of at least one, but fewer than N, of the bit trials across all of the different channels of ADC circuits on the same integrated circuit.

22. The method of claim 21, in which the pre-defined subset is limited to one or any combination of:
(1) a bit trial for sampling a residue amplifier of a first-stage of a pipelined or other staged ADC;
(2) a bit trial of a first-stage ADC of a pipelined or other staged ADC occurring upon loading bit trial results of an auxiliary mini ADC onto the first stage ADC;
(3) a most significant bit (MSB) bit trial; or
(4) a selected bit trial of the N-bits placing a largest capacitance value onto a reference voltage node.

23. The method of claim 21, in which the synchronizing include synchronizing results of corresponding individual bit trials.

* * * * *